(12) United States Patent
Zhou

(10) Patent No.: US 10,115,717 B2
(45) Date of Patent: Oct. 30, 2018

(54) ELECTROSTATIC DISCHARGE PROTECTION STRUCTURE AND FABRICATION METHOD THEREOF

(71) Applicants: Semiconductor Manufacturing International (Beijing) Corporation, Beijing (CN); Semiconductor Manufacturing International (Shanghai) Corporation, Shanghai (CN)

(72) Inventor: Fei Zhou, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 62 days.

(21) Appl. No.: 15/262,930

(22) Filed: Sep. 12, 2016

(65) Prior Publication Data

US 2017/0194312 A1    Jul. 6, 2017

(30) Foreign Application Priority Data

Jan. 6, 2016    (CN) .......................... 2016 1 0008649

(51) Int. Cl.
*H01L 23/60*    (2006.01)
*H01L 27/02*    (2006.01)
(Continued)

(52) U.S. Cl.
CPC .. *H01L 27/0255* (2013.01); *H01L 21/823814* (2013.01); *H01L 21/823821* (2013.01);
(Continued)

(58) Field of Classification Search
CPC .............. H01L 27/0255; H01L 29/165; H01L 29/66545; H01L 21/823828;
(Continued)

(56) References Cited

U.S. PATENT DOCUMENTS

2013/0285208 A1    10/2013    Standaert et al.
2014/0131831 A1    5/2014    Wei et al.
(Continued)

OTHER PUBLICATIONS

The European Patent Office (EPO) The Extended European Search Report for 16207262.3 dated Jun. 2, 2017 8 Pages.

*Primary Examiner* — Julio J Maldonado
*Assistant Examiner* — Stanetta Isaac
(74) *Attorney, Agent, or Firm* — Anova Law Group, PLLC

(57) ABSTRACT

A method is provided for fabricating an electrostatic discharge (ESD) protection structure. The method includes forming a substrate having a first region and a second region, wherein the first region and the second region have a preset distance; forming a well area in the substrate; forming a first fin portion in the substrate in the first region and a second fin portion in the substrate in the second region; forming a supporting gate structure, wherein the supporting gate structure includes a first supporting gate crossing the first fin portion and a second supporting gate crossing the second fin portion; forming a dielectric layer on the well area; and forming a conductive structure in the dielectric layer, wherein the conductive structure includes a first conductive structure connecting to the first fin portion and a second conductive structure connecting to the second fin portion.

18 Claims, 4 Drawing Sheets

(51) Int. Cl.
*H01L 21/8238* (2006.01)
*H01L 27/092* (2006.01)
*H01L 29/08* (2006.01)
*H01L 29/16* (2006.01)
*H01L 29/165* (2006.01)
*H01L 29/66* (2006.01)
*H01L 29/78* (2006.01)
*H01L 29/861* (2006.01)
H01L 29/06 (2006.01)
H01L 29/161 (2006.01)

(52) U.S. Cl.
CPC .. *H01L 21/823828* (2013.01); *H01L 27/0296* (2013.01); *H01L 27/0924* (2013.01); *H01L 29/0657* (2013.01); *H01L 29/0692* (2013.01); *H01L 29/0847* (2013.01); *H01L 29/165* (2013.01); *H01L 29/1608* (2013.01); *H01L 29/66545* (2013.01); *H01L 29/7848* (2013.01); *H01L 29/861* (2013.01); *H01L 29/0649* (2013.01); *H01L 29/161* (2013.01)

(58) Field of Classification Search
CPC ..... H01L 21/823814; H01L 21/823821; H01L 29/0649; H01L 27/0296; H01L 29/1608; H01L 29/161; H01L 29/0847; H01L 29/0692; H01L 27/0924
See application file for complete search history.

(56) References Cited

U.S. PATENT DOCUMENTS

2014/0183641 A1 7/2014 Fan et al.
2015/0187753 A1 7/2015 Campi et al.

ELECTROSTATIC DISCHARGE PROTECTION STRUCTURE AND FABRICATION METHOD THEREOF

CROSS-REFERENCES TO RELATED APPLICATIONS

This application claims the priority of Chinese patent application No. 201610008649.7, filed on Jan. 6, 2016, the entirety of which is incorporated herein by reference.

FIELD OF THE INVENTION

The present invention generally relates to the field of semiconductor manufacturing and, more particularly, relates to an electrostatic discharge protection structure and fabrication techniques thereof.

BACKGROUND

With more and more widespread use of semiconductor chips, an increasing number of factors can cause electrostatic damages to the semiconductor chips. In the existing design of a chip, an electrostatic discharge (ESD) protection structure is often applied in the chip to reduce damages to the chip.

The design and application of an existing ESD protection circuit often include: gate ground N-type field-effect-transistor (GGNMOS) protection circuits, shallow trench isolation structure diode (STI diode) protection circuits, gated diode protection circuits, laterally diffused MOS (LDMOS) protection circuits, bipolar junction transistor (BJT) protection circuits, etc.

FIG. 1 illustrates an existing ESD protection structure. As shown in FIG. 1, the ESD protection structure includes an STI diode. The STI diode includes a substrate 10, an N-type well area 11 formed in the substrate 10, an isolation structure 12 formed in the N-type well area 11, and an N-type region 13n and a P-type region 13p formed at both sides of the isolation structure 12. The P-type region 13p is grounded, and an electrostatic voltage is applied on the N-type region 13n.

The P-type region 13p and the N-type region 13n form a PN junction. The electrostatic voltage is applied on the N-type region 13n, and the P-type region 13p is grounded. When the electrostatic voltage reversely breaks down the PN junction, electrostatic charges can be released from the N-type region 13n to the ground through the N-type well area 11 and the P-type region 13p.

However, such ESD protection structure often has issues of low manufacturing yield and unstable performance. The disclosed device structures and methods are directed to solve one or more problems set forth above and other problems.

BRIEF SUMMARY OF THE DISCLOSURE

One aspect of the present disclosure includes an ESD protection structure. The ESD protection structure includes a substrate having a first region and a second region, wherein the first region and the second region are separated by a preset distance; and a well area formed in the substrate, wherein the well area covers the first region, the second region, and a region between the first region and the second region. The ESD protection structure also includes a first fin portion formed in the substrate in the first region and a second fin portion formed in the substrate in the second region, wherein the first fin portion has first-type doping ions and the second fin portion has second-type doping ions; and a dielectric layer, wherein the dielectric layer covers the well area between the first region and the second region, the first fin portion, and the second fin portion. Further, the ESD protection structure includes a supporting gate structure formed in the dielectric layer, wherein the supporting gate structure includes a first supporting gate crossing the first fin portion and covering portions of top and side surfaces of the first fin portion, and a second supporting gate crossing the second fin portion and covering portions of top and side surfaces of the second fin portion. In addition, the ESD protection structure includes a conductive structure formed in the dielectric layer, wherein the conductive structure includes a first conductive structure connecting to the first fin portion and being configured to connect to a first bias voltage, and a second conductive structure connecting to the second fin portion and being configured to connect to a second bias voltage, and the first bias voltage and the second bias voltage are not equal to one another.

Another aspect of the present disclosure includes a method for fabricating an ESD protection structure. The method includes forming a substrate having a first region and a second region, wherein the first region and the second region are separated by a preset distance; and forming a well area in the substrate, wherein the well area covers the first region, the second region, and a region between the first region and the second region. The method also includes forming a first fin portion in the substrate in the first region and a second fin portion in the substrate in the second region, wherein the first fin portion has first-type doping ions and the second fin portion has second-type doping ions; and forming a supporting gate structure, wherein the supporting gate structure includes a first supporting gate crossing the first fin portion and covering portions of top and side surfaces of the first fin portion, and a second supporting gate crossing the second fin portion and covering portions of top and side surfaces of the second fin portion. Further, the method includes forming a dielectric layer on the well area between the first region and the second region, and between the first fin portion, the second fin portion, and the supporting gate structure, wherein the supporting gate structure is in the dielectric layer; and forming a conductive structure in the dielectric layer, wherein the conductive structure includes a first conductive structure connecting to the first fin portion and being configured to connect to a first bias voltage, and a second conductive structure connecting to the second fin portion and being configured to connect to a second bias voltage, and the first bias voltage and the second bias voltage are not equal to one another.

Other aspects of the present disclosure can be understood by those skilled in the art in light of the description, the claims, and the drawings of the present disclosure.

DETAILED DESCRIPTION

An ESD protection structure formed by existing techniques often has issues such as low manufacturing yield and unstable performance. Based on the structure of the ESD protection structure formed by existing techniques, reasons for the described issues are analyzed.

Figure 1:
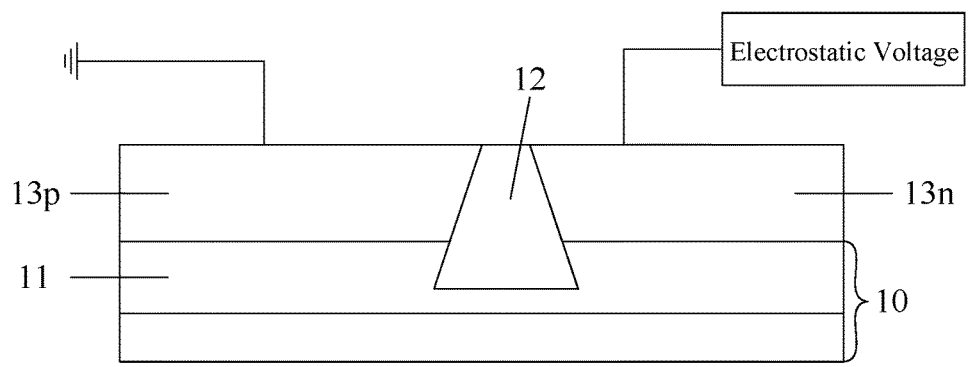
FIG. 1 illustrates an existing ESD protection structure.
Figure 2:
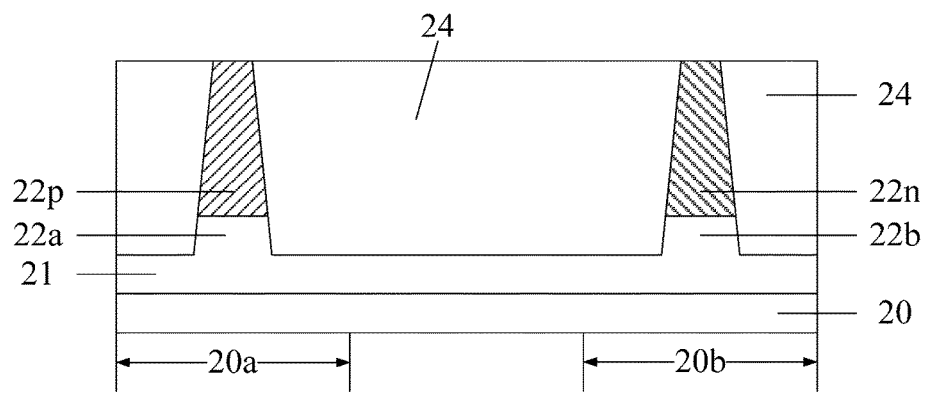
FIG. 2 illustrates another existing ESD protection structure.

FIG. 2 illustrates another existing ESD protection structure. As shown in FIG. 2, the ESD protection structure includes an STI diode. The STI diode includes: a substrate 20 having a first region 20a and a second region 20b, while the first region 20a and the second region 20b are separated by a preset distance; a well area 21 in the substrate 20, where the well area 21 covers the first region 20a, the second region 20b, and a region between the first region 20a and the second region 20b; a first fin 22a on the substrate 20 in the first region 20a and a second fin 22b on the substrate 20 in the second region 20b, where the first fin 22a has a P-type doping region 22p and the second fin 22b has an N-type doping region 22n; and a dielectric layer 24, where the dielectric layer 24 covers the well area 21 between the first fin and the second fin, the first fin 22a, and the second fin 22b.

The P-type doping region 22p and the N-type doping region 22n form a PN junction. An electrostatic voltage is applied on the N-type doping region 22n, and the P-type doping region 22p is grounded. When the electrostatic voltage reversely breaks down the PN junction, electrostatic charges can be released from the N-type doping region 22n to the ground through the N-type well area 21 and the P-type doping region 22p.

When the ESD protection structure is formed, steps for forming the dielectric layer 24 or for forming semiconductor structures other than the ESD protection structure on the substrate often require a chemical mechanical polishing process to obtain a flat and smooth surface. When the chemical mechanical polishing process is performed, concavities are prone to be formed in the dielectric layer, therefore affecting the quality of the formed dielectric layer, affecting the electrical isolation property of the dielectric layer, and affecting the manufacturing yield of the formed ESD protection structure.

According to the disclosed device structures and methods, the dielectric layer concavities issue and the other issues may be overcome by forming a supporting gate structure to avoid the impact of the concavities in the dielectric layer.

Reference will now be made in detail to exemplify embodiments of the invention, which are illustrated in the accompanying drawings. Wherever possible, the same reference numbers will be used throughout the drawings to refer to the same or the alike parts.

Figure 3:
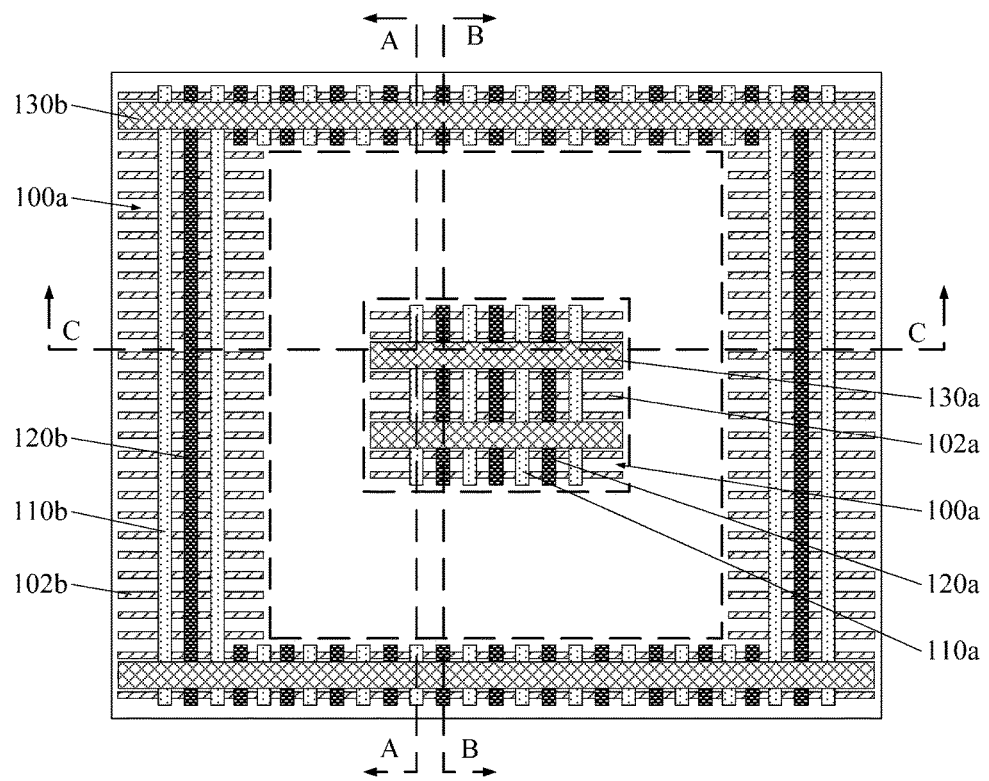
FIGS. 3-6 illustrate an exemplary ESD protection structure consistent with the disclosed embodiments.
Figure 4:
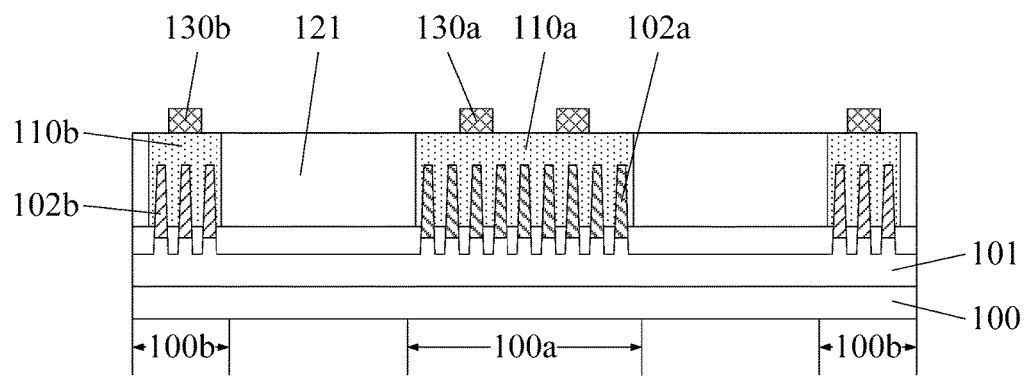
Figure 5:
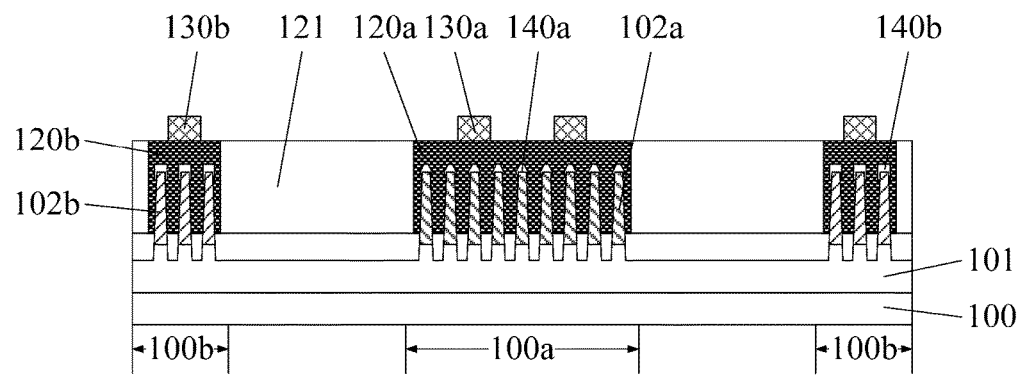
Figure 6:
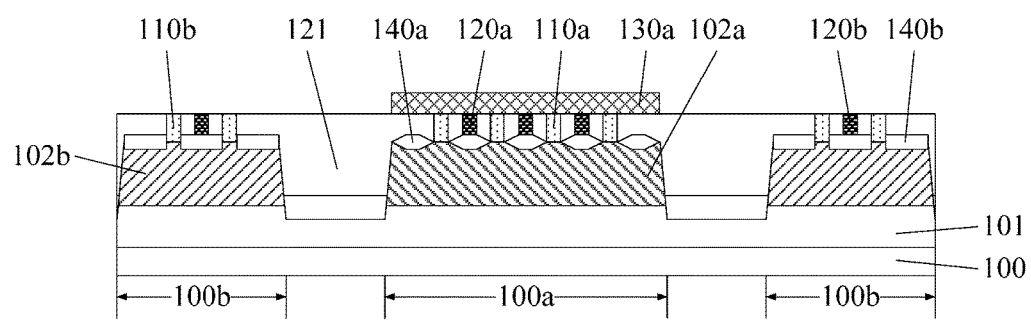

FIGS. 3-6 illustrate an exemplary ESD protection structure consistent with the disclosed embodiments. Specifically, FIG. 4 is a cross-sectional view along a line AA in FIG. 3, FIG. 5 is a cross-sectional view along a line BB in FIG. 3, and FIG. 6 is a cross-sectional view along a line CC in FIG. 3.

As shown in FIGS. 3-6, the ESD protection structure may include a substrate 100. The substrate 100 may have a first region 100a and a second region 100b. The first region 100a and the second region 100b may be separated by a preset distance. In one embodiment, the formed ESD protection structure may form an STI diode.

The substrate 100 may be a platform for subsequent fabrication processes. The first region 100a may be configured to form an anode of the STI diode, and the second region 100b may be configured to form a cathode of the STI diode.

In one embodiment, the anode may be grounded. That is, the first region 100a may be grounded and configured to receive a first bias voltage. The cathode may be connected to an electrostatic discharge terminal. That is, the second region 100b may be connected to the electrostatic discharge terminal and configured to receive a second bias voltage. The first bias voltage and the second bias voltage may not be equal to each other. When electrostatic charges are released, electric current may flow in from the second region 100b and may flow out from the first region 100a to discharge the electrostatic charges.

The substrate 100 may include monocrystalline silicon, polycrystalline silicon, amorphous silicon, silicon (Si), germanium (Ge), germanium-silicon alloy (GeSi), or gallium arsenide (GaAs), etc. The substrate 100 may include other semiconductor materials, and the present invention is not limited to these examples. In one embodiment, the substrate 100 is monocrystalline silicon.

The first region 100a and the second region 100b may be separated by the preset distance between each other to achieve electrical isolation between the anode and the cathode of the STI diode. If the preset distance between the first region 100a and the second region 100b is too small, the electrical isolation performance between the first region 100a and the second region 100b may be affected. If the preset distance between the first region 100a and the second region 100b is too large, it may affect reducing the volume of the ESD protection structure, and impacting device integration degree. In one embodiment, the preset distance between the first region 100a and the second region 100b is in a range of approximately 0.2-1 um.

In one embodiment, the second region 100b surrounds the first region 100a, such that the electrostatic charges flow in from the second region 100b, and concentrate in and flow out from the first region 100a surrounded by the second region 100b. Therefore, damages caused by the electrostatic charges onto the devices in other regions of the substrate 100 are avoided, and the protection ability of the formed ESD protection structure is improved.

The second region 100b surrounding the first region 100a is only an example. In certain other embodiments, the second region may be parallel to the first region. Other arrangements may also be used.

Further, to improve the device density and to improve the device integration degree, in one embodiment, the shape of the first region 100a may be a square; the second region 100b may be a square annular shape; and the first region 100a may be at the center of the second region 100b.

As shown in FIGS. 3-6, the ESD protection structure may also include a well area 101 formed in the substrate 100, where the well area 101 may cover the first region 100a, the second region 100b, and the region between the first region 100a and the second region 100b.

Within the well area 101, the substrate 100 in the first region 100a and the substrate 100 in the second region 100b may be connected, such that the first region 100a and the second region 100b may be electrically connected through the substrate 100. Therefore, electrostatic current can be released or discharged through the well area 101. Specifically, the well area 101 may be formed by performing an ion implantation process onto the substrate 100.

In one embodiment, the well area 101 may be an N-type well area. That is, the well area 101 may be doped with N-type doping ions. Specifically, the N-type impurity ion may be one or more of phosphorus ions, arsenic ions, and antimony ions.

As shown in FIGS. 3-6, in addition, the ESD protection structure may include a first fin portion 102a formed in the substrate 100 in the first region 100a, and a second fin portion 102b formed in the substrate 100 in the second region 100*b*. The first fin portion 102*a* may have first-type doping ions and the second fin portion 102*b* may have second-type doping ions. The first fin portion 102*a* and the second fin portion 102*b* each may include one or more fins.

The first fin portion 102*a* may be configured to form an anode of the STI diode and the second fin portion 102*b* may be configured to form a cathode of the STI diode. Therefore, the first-type doping ions and the second-type doping ions may be counter ions.

In one embodiment, the well area 101 may be an N-type well area and, therefore, the first-type doping ions may be P-type ions and the second-type doping ions may be N-type ions. Specifically, the P-type impurity ion may be one or more of boron ions, gallium ions, and indium ions. The N-type impurity ion may be one or more of phosphorus ions, arsenic ions, and antimony ions. Further, the concentration of doping ions in the first fin portion 102*a* may be in a range of approximately $1.0 \times 10^{14}$-$5.0 \times 10^{15}$ atoms/cm$^3$; and the concentration of doping ions in the second fin portion 102*b* is may be a range of approximately $5.0 \times 10^{12}$-$1.0 \times 10^{14}$ atoms/cm$^3$.

As shown in FIGS. 3-6, moreover, the ESD protection structure may include a dielectric layer 121, covering the well area 101 between the first region 100*a* and the second region 100*b*, the first fin portion 102*a*, and the second fin portion 102*b*.

The dielectric layer 121 may be configured to electrically isolate the first region 100*a* and the second region 100*b* and to electrically isolate different semiconductor structures. Specifically, the dielectric layer 121 may be made of silicon oxide, silicon nitride, silicon oxynitride, low-K dielectric materials (dielectric constant is greater than or equal to 2.5 and is less than 3.9, such as porous silicon oxide, or porous silicon nitride), or ultra-low-K dielectric materials (dielectric constant is less than 2.5, such as porous SiCOH), etc.

Forming the dielectric layer 121 and/or forming the semiconductor structures on other regions of the substrate 100 may require performing a chemical mechanical polishing process, so as to obtain a flat and smooth surface. When the chemical mechanical polishing process is performed, concavities may be prone to be formed in the dielectric layer, therefore limiting the process window for forming the ESD protection structure, and affecting the manufacturing yield of the formed ESD protection structure.

As shown in FIGS. 3-6, further, the ESD protection structure may include a supporting gate structure. The supporting gate structure may include a first supporting gate 110*a* crossing the first fin portion 102*a*, and the first supporting gate 110*a* may cover portions of top and side surfaces of the first fin portion 102*a*. The supporting gate structure may also include a second supporting gate 110*b* crossing the second fin portion 102*b*, and the second supporting gate 110*b* may cover portions of top and side surfaces of the second fin portion 102*b*.

The supporting gate structure may be configured to increase gate density in the first region 100*a* and the second region 100*b*, and may play a supportive role in the subsequent chemical mechanical polishing process, to avoid forming the concavities in the dielectric layer 121 in the first region 100*a* and the second region 100*b*.

In one embodiment, the supporting gate structure may be a dummy gate, and the supporting gate structure may be made of polysilicon. The supporting gate structure can be formed simultaneously with dummy gates of semiconductor structures in other regions of the substrate 100. When the dummy gates of semiconductor structures in other regions of the substrate 100 are replaced by metal gates, the supporting gate structure may also be replaced by a metal gate.

In certain other embodiments, the supporting structure can also be a polysilicon gate or a metal gate, etc.

As shown in FIGS. 3-6, furthermore, the ESD protection structure may include a conductive structure formed in the dielectric layer 121. The conductive structure may include a first conductive structure 120*a* connecting to the first fin portion 102*a*, and the first conductive structure may be configured to connect to the first bias voltage. The conductive structure may also include a second conductive structure 120*b* connecting to the second fin portion 102*b*, and the second conductive structure may be configured to connect to the second bias voltage. The first bias voltage and the second bias voltage are not equal.

The first conductive structure 120*a* and the second conductive structure 120*b* may be configured to transfer the electrostatic charges. The first conductive structure 120*a* may be configured to make the first fin portion 102*a* electrically connect to the first bias voltage. The second conductive structure 120*b* may be configured to make the second fin portion 102*b* electrically connect to the second bias voltage. In one embodiment, the second conductive structure 120*b* is connected to the electrostatic discharge terminal to input the electrostatic charges, and the first conductive structure 120*a* is grounded to discharge the electrostatic charges.

In one embodiment, the first conductive structure 120*a* may cross the first fin portion 102*a*, and the first conductive structure 120*a* may cover portions of side and top surfaces of the first fin portion 102*a*. The second conductive structure 120*b* may cross the second fin portion 102*b*, and the second conductive structure 120*b* may cover portions of side and top surfaces of the second fin portion 102*b*.

However, the configuration or arrangement of the first conductive structure 120*a* and the second conductive structure 120*b* are only exemplary. In various embodiments, it may be desired that the first conductive structure 120*a* and the second conductive structure 120*b* may to be respectively electrically connected to the first fin portion 102*a* and the second fin portion 102*b*.

The first region 100*a* may also include the first supporting gate 110*a* crossing the first fin portion 102*a*; and the second region 100*b* may also include the second supporting gate 110*b* crossing the second fin portion 102*b*. Therefore, to reduce the fabrication difficulty and to improve the performance of the device, the first conductive structure 120*a* and the first supporting gate 110*a* may be arranged in parallel; and the second conductive structure 120*b* and the second supporting gate 110*b* may be arranged in parallel.

In one embodiment, in the ESD protection structure, the number of the first conductive structure 120*a* and the second conductive structure 120*b* may be more than one; and the number of the first supporting gate 110*a* and the second supporting gate 110*b* may be more than one. To improve the supporting ability of the supporting gate structure and to improve the gate density in the first region 100*a* and the second region 100*b*, the first conductive structure 120*a* and the first supporting gate 110*a* may be alternately arranged; and the second conductive structure 120*b* and the second supporting gate 110*b* are alternately arranged.

Further, in one embodiment, the first supporting gate 110*a* may also be electrically connected to the first bias voltage; and the second supporting gate 110*b* may also be electrically connected to the second bias voltage.

Specifically, in one embodiment, the first supporting gate 110*a* and the first fin portion 102*a* may be grounded; and the second supporting gate 110b and the second fin portion 102b may be connected to the electrostatic discharge terminal. Therefore, conduction current may be less likely to be generated in the first fin portion 102a and the second fin portion 102b, and electrostatic charges may be less likely to completely flow within the well area 101. The leakage current in the supporting gate structure may be reduced. It should be noted that, the described functions the first supporting gate 110a and the second supporting gate 110b are only exemplary. In certain other embodiments, the first supporting gate and the second supporting gate may not load any signals, and other arrangements may also be used.

As shown in FIGS. 3-6, moreover, the ESD protection structure may include a first conductive layer and a second conductive layer.

To make the first supporting gate 110a and the first fin portion 102a electrically connected to the first bias voltage, and to make the second supporting gate 110b and the second fin portion 102b electrically connected to the second bias voltage, in one embodiment, the ESD protection structure may also include a first conductive layer 130a and a second conductive layer 130b.

The first conductive layer 130a may be formed on the dielectric layer 121 and may contact with the first supporting gate 110a and the first conductive structure 120a, to receive the first bias voltage. The second conductive layer 130b may be formed on the dielectric layer 121 and may contact with the second supporting gate 110b and the second conductive structure 120b, to receive the second bias voltage.

Specifically, in one embodiment, the first conductive layer 130a may be formed on the dielectric layer 121 and may be electrically connected to the top surface of the first supporting gate 110a and the first fin portion 102a. The first supporting gate 110a and the first fin portion 102a may receive the first bias voltage through the first conductive layer 130a. The second conductive layer 130b may be formed on the dielectric layer 121 and may be electrically connected to the top surface of the second supporting gate 110b and the second fin portion 102b. The second supporting gate 110b and the second fin portion 102b may receive the second bias voltage through the second conductive layer 130b.

In one embodiment, the first conductive layer 130a may be in a stripe or bar shape, and the first supporting gate 110a and the first conductive structure 120a may be arranged in parallel. Thus, the first conductive layer 130a may be vertically arranged with or perpendicular to the first supporting gate 110a and the first conductive structure 120a. The second conductive layer 130b may also be in a stripe or bar shape, and the second supporting gate 110b and the second conductive structure 120b may be arranged to be parallel to each other. Thus, the second conductive layer 130b may be vertically arranged or may be perpendicular to the second supporting gate 110b and the second conductive structure 120b.

As shown in FIGS. 3-6, further, the ESD protection structure may include a first epitaxial layer and a second epitaxial layer. The first epitaxial layer 140a may be formed in the first fin portion 102a at both sides of the first supporting gate 110a, and the first epitaxial layer 140a may have first-type doping ions. The second epitaxial layer 140b may be formed in the second fin portion 102b at both sides of the second supporting gate 110b, and the second epitaxial layer 140b may have second-type doping ions. The first epitaxial layer 140a and the second epitaxial layer 140b may improve the electrostatic discharge capacity of the ESD protection structure.

Accordingly, the first epitaxial layer 140a and the second epitaxial layer 140b may be at both sides of the first supporting gate 110a and the second supporting gate 110b, respectively. That is, the first supporting gate 110a and the second supporting gate 110b may divide the first epitaxial layer 140a and the second epitaxial layer 140b into many small-area epitaxial layers, respectively. Such structure may be able to avoid forming large-area epitaxial layers on the surface of the ESD protection structure; avoid the accumulation of the electrostatic charges on the large-area epitaxial layers, which may affect the protection performance of the ESD protection structure; and improve the performance of the ESD protection structure.

Specifically, in one embodiment, the first epitaxial layer 140a may be on the top of the first fin portion 102a and the second epitaxial layer 140b may be on the top of the second fin portion 102b. Therefore, the first conductive structure 120a may be connected to the first fin portion 102a through the first epitaxial layer 140a, and the second conductive structure 120b may be connected to the second fin portion 102b through the second epitaxial layer 140b.

In one embodiment, the well area may be an N-type well area. The first region 100a is configured to form an anode connected to the ground; and the second region 100b may be configured to form a cathode connected to the electrostatic discharge terminal. Therefore, the first-type doping ions in the first epitaxial layer 140a may be P-type ions; and the second-type doping ions in the second epitaxial layer 140b may be N-type ions.

The first-type doping ions may be P-type ions, and the first epitaxial layer 140a may be an "Σ" shaped epitaxial layer made of silicon and germanium materials. The second-type doping ions may be N-type ions, and the second epitaxial layer 140b may be a square-shaped epitaxial layer made of silicon and carbon materials.

Correspondingly, the present invention also provides a method for fabricating an ESD protection structure, which may include: forming a substrate, where the substrate may have a first region and a second region, and the first region and the second region may be separated by a preset distance; forming a well area, where the well area may cover the first region, the second region and a region between the first region and the second region; forming a first fin portion in the substrate in the first region and a second fin portion in the substrate in the second region, where the first fin portion may have first-type doping ions and the second fin portion may have second-type doping ions; forming a supporting gate structure, where the supporting gate structure may include a first supporting gate crossing the first fin portion and covering portions of top and side surfaces of the first fin portion, and a second supporting gate crossing the second fin portion and covering portions of top and side surfaces of the second fin portion; forming a dielectric layer on the well area between the first region and the second region, and between the first fin portion, the second fin portion, and the supporting gate structure, where the supporting gate structure may be in the dielectric layer; and forming a conductive structure in the dielectric layer, where the conductive structure may include a first conductive structure connecting to the first fin portion and being configured to connect to the first bias voltage, and a second conductive structure connecting to the second fin portion and being configured to connect to the second bias voltage, and the first bias voltage and the second bias voltage are not equal to each other.

Figure 7:
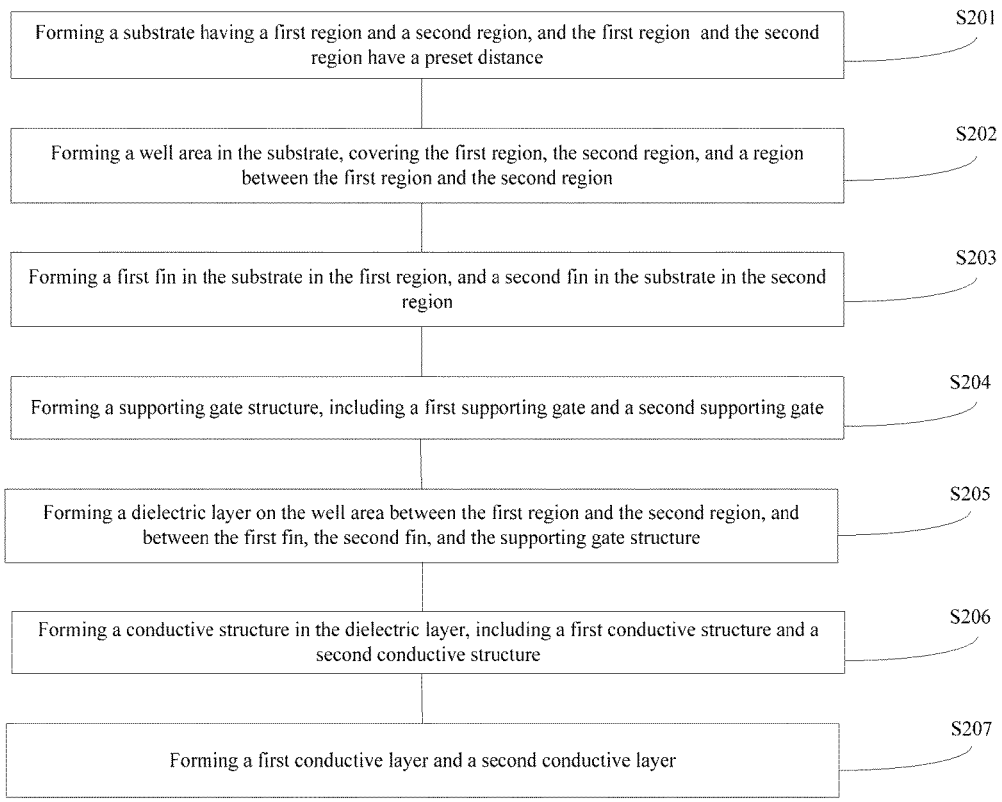
FIG. 7 illustrates an exemplary fabrication process to form an ESD protection structure consistent with the disclosed embodiments.

Specifically, FIG. 7 illustrates an exemplary fabrication process to form an EST protection structure consistent with the disclosed embodiments. FIGS. 3-6 illustrate an exemplary ESD protection structure consistent with the disclosed embodiments. Specifically, FIG. 4 is a cross-sectional view along a line AA in FIG. 3, FIG. 5 is a cross-sectional view along a line BB in FIG. 3, and FIG. 6 is a cross-sectional view along a line CC in FIG. 3.

As shown in FIG. 7, at the beginning of the fabrication process, a substrate having a first region and a second region may be formed (S201).

As shown in FIGS. 3-6, a substrate 100 having a first region 100a and a second region 100b may be formed, and the first region 100a and the second region 100b may be separated by a preset distance. In one embodiment, the formed ESD protection structure may form an STI diode.

The substrate 100 may be a platform for subsequent fabrication processes. The first region 100a may be configured to form an anode of the STI diode and the second region 100b may be configured to form a cathode of the STI diode. In one embodiment, the anode may be grounded. That is, the first region 100a may be grounded and configured to receive a first bias voltage. The cathode may be connected to an electrostatic discharge terminal. That is, the second region 100b may be connected to the electrostatic discharge terminal and configured to receive a second bias voltage. The first bias voltage and the second bias voltage may not be equal to each other. When electrostatic charges are released, electric current may flow in from the second region 100b and may flow out from the first region 100a to discharge the electrostatic charges.

The first region 100a and the second region 100b may be separated by the preset distance between each other to achieve electrical isolation between the anode and the cathode of the STI diode. If the preset distance between the first region 100a and the second region 100b is too small, the electrical isolation performance between the first region 100a and the second region 100b may be affected. If the preset distance between the first region 100a and the second region 100b is too large, it may affect reducing the volume of the ESD protection structure, and impacting device integration degree. In one embodiment, the preset distance between the first region 100a and the second region 100b is in a range of approximately 0.2-1 um.

In one embodiment, the second region 100b surrounds the first region 100a, such that the electrostatic charges flow in from the second region 100b, and concentrate in and flow out from the first region 100a surrounded by the second region 100b. Therefore damages caused by electrostatic charges onto the devices in other regions of the substrate 100 are avoided and the protection ability of the formed ESD protection structure is improved.

The second region 100b surrounding the first region 100a is only an example. In certain other embodiments, the second region may be parallel to the first region. Other arrangements may also be used.

Further, to improve the device density and to improve the device integration degree, in one embodiment, the shape of the first region 100a is a square; the second region 100b is a square annular shape; and the first region 100a is at the center of the second region 100b.

As shown in FIG. 7, after forming the substrate, a well area may be formed in the substrate (S202).

As shown in FIGS. 3-6, a well area 101 may be formed in the substrate 100, where the well area 101 may cover the first region 100a, the second region 100b and the region between the first region 100a and the second region 100b.

Within the well area 101, the substrate 100 in the first region 100a and the substrate 100 in the second region 100b may be connected, such that the first region 100a and the second region 100b may be electrically connected through the substrate 100. Therefore, electrostatic current can be released through the well area 101. Specifically, the well area 101 may be formed by performing an ion implantation process onto the substrate 100.

In one embodiment, the well area 101 is an N-type well area. That is, the well area 101 has N-type doping ions. Specifically, the N-type impurity ion is one or more of phosphorus ion, arsenic ion, and antimony ion.

As shown in FIG. 7, after forming the well area, a first fin portion and a second fin portion may be formed (S203).

As shown in FIGS. 3-6, a first fin portion 102a may be formed in the substrate 100 in the first region 100a, and a second fin portion 102b may be formed in the substrate 100 in the second region 100b. The first fin portion 102a may have first-type doping ions and the second fin portion 102b may have second-type doping ions. The first fin portion 102a and the second fin portion 102b each may include one or more fins.

The first fin portion 102a may be configured to form an anode of the STI diode and the second fin portion 102b may be configured to form a cathode of the STI diode. Therefore, the first-type doping ions and the second-type doping ions may be counter ions.

In one embodiment, forming the substrate 100, the first fin portion 102a, and the second fin portion 102b may include: providing a semiconductor substrate; etching the semiconductor substrate to form the substrate 100, and the first fin portion 102a and the second fin portion 102b on the substrate 100.

The semiconductor substrate may be configured to provide an operating platform for subsequent fabrication processes, and to be etched to form the first fin portion 102a and the second fin portion 102b. The semiconductor substrate may include monocrystalline silicon, polycrystalline silicon, amorphous silicon, silicon (Si), germanium (Ge), germanium-silicon alloy (GeSi), or gallium arsenide (GaAs), etc. The substrate 100 may include other semiconductor materials, and the present invention is not limited to these examples. In one embodiment, the substrate 100, the first fin portion 102a, and the second fin portion 102b are made of monocrystalline silicon.

In certain other embodiments, the semiconductor substrate may also be selected from silicon structures having an epitaxial layer or on an epitaxial layer. Specifically, the semiconductor substrate may include a substrate and a semiconductor layer on the substrate. The semiconductor layer can be formed on the substrate by a selective epitaxial deposition process. The substrate may include a silicon substrate, a germanium silicon substrate, a silicon carbide substrate, a silicon on insulator (SOI) substrate, a germanium on insulator (GOI) substrate, a glass substrate, or other III-V compounds substrates, such as a gallium arsenide (GaAs) substrate and a gallium nitride (GaN) substrate, etc. The semiconductor layer may be made of silicon, germanium, silicon carbide, or germanium silicon, etc. The selection of the substrate and the semiconductor layer is not limited. The selected substrate can be adapted to process requirements or easy integration, and the selected material can be adapted to form the first fin portion 102a and the second fin portion 102b. The thickness of the semiconductor layer can be controlled by the epitaxial process, thus the height of the first fin portion 102a and the second fin portion 102b can be precisely controlled.

Forming the first fin portion 102a and the second fin portion 102b may include: forming a patterned first mask on the semiconductor substrate, where the patterned first mask may be configured to define the position and dimensions of the first fin portion 102a and the second fin portion 102b; and using the patterned first mask as a mask, an etching process may be performed onto the semiconductor substrate to form the substrate 100, and the first fin portion 102a and the second fin portion 102b on the substrate.

The patterned first mask may be configured to define the position and dimensions of the first fin portion 102a and the second fin portion 102b. Forming the patterned first mask may include: forming a first mask material layer on the semiconductor substrate; forming a first patterned layer on the first mask material layer; and using the first patterned layer as a mask, an etching process may be performed onto the first mask material layer until the surface of the semiconductor substrate is exposed, to form the patterned first mask.

The first patterned layer may be a patterned photoresist layer, and may be formed by coating and lithography processes. To decrease the characteristic dimensions of the first fin portion 102a and the second fin portion 102b, and to decrease the distance between the adjacent first fin portion 102a and the second fin portion 102b, the first patterned layer may be formed by a multiple patterned mask process. The multiple patterned mask process may include a self-aligned double patterned (SaDP) process, a self-aligned triple patterned (SaTP) process, or a self-aligned double double patterned (SaDDP) process, etc.

The process of etching the semiconductor substrate may be an anisotropic dry etching process. Therefore, the sidewalls of the formed first fin portion 102a and second fin portion 102b may be vertical or inclined with respect to the surface of the substrate 100. When the sidewalls of the formed first fin portion 102a and second fin portion 102b are inclined with respect to the surface of the substrate 100, the bottom dimensions of the first fin portion 102a and the second fin portion 102b may be larger than the top dimensions of the first fin portion 102a and the second fin portion 102b. Specifically, in one embodiment, the sidewalls of the formed first fin portion 102a and second fin portion 102b are inclined with respect to the surface of the substrate 100 with a certain angle, and the bottom dimensions of the first fin portion 102a and the second fin portion 102b are larger than the top dimensions of the first fin portion 102a and the second fin portion 102b.

In one embodiment, the well area 101 may be formed before forming the first fin portion 102a and the second fin portion 102b. Specifically, the method includes: providing a semiconductor substrate; performing an ion implantation process onto the semiconductor substrate to form the well area in the semiconductor substrate; and etching the semiconductor substrate to form the substrate 100, the first fin portion 102a, and the second fin portion 102b after performing the ion implantation process.

However, in certain other embodiments, the well area 101 may be formed after forming the first fin portion 102a and the second fin portion 102b. Specifically, after forming the substrate, the first fin portion, and the second fin portion, an ion implantation process is performed to form the well area in the substrate, the first fin portion, and the second fin portion.

Since the first fin portion 102a may have the first-type doping ions and the second fin portion 102b may have the second-type doping ions, forming the first fin portion 102a and the second fin portion 102b may also include: performing a first ion implantation process onto the first fin portion 102a; and performing a second ion implantation process onto the second fin portion 102b. In one embodiment, the first-type doping ions are P-type ions, and the second-type doping ions are N-type ions.

The first ion implantation process performed onto the first fin portion 102a may include: forming a second mask, where the second mask may expose the corresponding regions in the first region 100a; and using the second mask as a mask to perform the first ion implantation process onto the first fin portion 102a.

Specifically, in one embodiment, the parameters of the first ion implantation process include: the implantation ion is $BF^{2+}$; the implantation energy is in a range of approximately 2-10 KeV; and the implantation dose is in a range of approximately $1.0 \times 10^{14}$-$5.0 \times 10^{15}$ atoms/cm$^3$. Therefore, concentration of doped ions in the first fin portion 102a is in a range of approximately $1.0 \times 10^{14}$-$5.0 \times 10^{15}$ atoms/cm$^3$.

The second ion implantation process performed onto the second fin portion 102b may include: forming a third mask, where the third mask may expose the corresponding regions in the second region 100b; and using the third mask as a mask to perform the second ion implantation process onto the second fin portion 102b.

Specifically, in one embodiment, the parameters of the second ion implantation process include: the implantation ion is $P^+$; the implantation energy is in a range of approximately 90-180 KeV; and the implantation dose is in a range of approximately $5.0 \times 10^{12}$-$1.0 \times 10^{14}$ atoms/cm$^3$. Therefore, concentration of doped ions in the second fin portion 102b is in a range of approximately $5.0 \times 10^{12}$-$1.0 \times 10^{14}$ atoms/cm$^3$.

As shown in FIG. 7, after forming the first fin and the second fin, a supporting gate structure may be formed (S204).

As shown in FIGS. 3-6, a supporting gate structure may be formed. The supporting gate structure may include a first supporting gate 110a crossing the first fin portion 102a, and the first supporting gate 110a may cover portions of top and side surfaces of the first fin portion 102a. The supporting gate structure may also include a second supporting gate 110b crossing the second fin portion 102b, and the second supporting gate 110b may cover portions of top and side surfaces of the second fin portion 102b.

The supporting gate structure may be configured to increase gate density in the first region 100a and the second region 100b, and may play a supportive role in a subsequent chemical mechanical polishing process, to avoid forming the concavities in the dielectric layer 121 in the first region 100a and the second region 100b.

In one embodiment, the supporting gate structure may be made of polysilicon. The supporting gate structure 110 can be formed simultaneously with gates of the semiconductor structures in other regions of the substrate 100. The top surface of the supporting gate structure 110 may level with the top surface of the gates of the semiconductor structures in other regions of the substrate 100.

The supporting gate structure 110 can be formed simultaneously with gates of the semiconductor structures in other regions of the substrate 100. Therefore, when the gates of the semiconductor structures in other regions of the substrate 100 are made of metal, during subsequently forming the metal gate, the supporting gate structure in the ESD protection structure may also be replaced by a metal gate.

As shown in FIG. 7, after forming the supporting gate structure, a dielectric layer may be formed (S205).

As shown in FIGS. 3-6, a dielectric layer 121 may be formed on the well area between the first region and the second region, and between the first fin portion, the second fin portion and the supporting gate structure, where the supporting gate structure may be in the dielectric layer.

To improve the electrostatic discharge capacity of the ESD protection structure, after forming the supporting gate structure and before forming the dielectric layer, the method may also include: forming a first epitaxial layer 140a in the first fin portion 102a at both sides of the first supporting gate 110a, where the first epitaxial layer 140a may have first-type doping ions; and forming a second epitaxial layer 140b in the second fin portion 102b at both sides of the second supporting gate 110b, where the second epitaxial layer 140b may have second-type doping ions.

In one embodiment, the well area is an N-type well area. The first fin portion 102a may be configured to form an anode connected to the ground; and the second fin portion 102b may be configured to form a cathode connected to the electrostatic discharge terminal. Therefore, the first-type doping ions in the first epitaxial layer 140a may be P-type ions; and the second-type doping ions in the second epitaxial layer 140b may be N-type ions.

The first-type doping ions may be P-type ions, and the first epitaxial layer 140a may be an "Σ" shaped epitaxial layer made of silicon and germanium materials. The second-type doping ions may be N-type ions, and the second epitaxial layer 140b may be a square-shaped epitaxial layer made of silicon and carbon materials.

Specifically, in one embodiment, forming the first epitaxial layer 140a may include: forming a fourth mask being configured to define the position and dimensions of the first epitaxial layer 140a; using the fourth mask as a mask to etch the first supporting gate 110a at both sides of the first fin portion 102a; forming a first "Σ" shaped opening on the top surface of the first fin portion 102a at both sides of the first supporting gate 110a; filling the first opening with silicon and germanium materials to form the first epitaxial layer 140a; and implanting the first-type doping ions into the first epitaxial layer 140a.

Specifically, in one embodiment, forming the second epitaxial layer 140b may include: forming a fifth mask being configured to define the position and dimensions of the second epitaxial layer 140b; using the fifth mask as a mask to etch the second supporting gate 110b at both sides of the second fin portion 102b; forming a second square-shaped opening on the top surface of the second fin portion 102b at both sides of the second supporting gate 110b; filling the second opening with silicon and carbon materials to form the second epitaxial layer 140b; and implanting the second-type doping ions into the second epitaxial layer 140b.

The described implantation process to implant the first-type doping ions and the second-type doping ions are only exemplary. In certain other embodiments, the first-type doping ions and the second-type doping ions can also be implanted using an in-situ doping process during the epitaxial growth of forming the first epitaxial layer 140a and the second epitaxial layer 140b. Other suitable implantation processes may also be used.

Since during the epitaxial process of forming the first epitaxial layer 140a and the second epitaxial layer 140b, the first region 100a and the second region 100b may be provided with the supporting gate structure, therefore the first epitaxial layer 140a and the second epitaxial layer 140b may be at both sides of the first supporting gate 110a and the second supporting gate 110b, respectively. Such structure may be able to avoid forming large-area epitaxial layers on the surface of the ESD protection structure; avoid the accumulation of the electrostatic charges on the large-area epitaxial layers, which may affect the protection performance of the ESD protection structure; and improve the performance of the ESD protection structure.

The dielectric layer 121 may be configured to electrically isolate the first region 100a and the second region 100b and to electrically isolate different semiconductor structures. Specifically, the dielectric layer 121 may be made of silicon oxide, silicon nitride, silicon oxynitride, low-K dielectric materials (dielectric constant is greater than or equal to 2.5 and is less than 3.9, such as porous silicon oxide, or porous silicon nitride), or ultra-low-K dielectric materials (i.e., the dielectric constant being less than 2.5, such as porous SiCOH), etc.

The top of the dielectric layer 121 may expose the supporting gate structure. Accordingly, forming the dielectric layer may include: forming a dielectric material layer covering the well area 101 between the first region 100a and the second region 100b, the first fin portion 102a, the second fin portion 102b, and the supporting gate structure; and planarizing the dielectric material layer by a chemical mechanical polishing process to form the dielectric layer 121, such that the dielectric layer 121 may expose the supporting gate structure.

Since the supporting gate structure may be formed in the dielectric layer 121, when the chemical polishing process is performed onto the dielectric material layer, the supporting gate structure may play a supportive role. Such structure may be able to avoid the occurrence of the concavities on the surface of the dielectric layer 121; expand the process window of the chemical mechanical polishing process; and improve the manufacturing yield of the formed ESD protection structure.

As shown in FIG. 7, after forming the dielectric layer, a conductive structure may be formed (S206).

As shown in FIGS. 3-6, a conductive structure may be formed in the dielectric layer 121. The conductive structure may include a first conductive structure 120a connected to the first fin portion 102a, being configured to be connected to the first bias voltage. The conductive structure may also include a second conductive structure 120b connected to the second fin portion 102b, being configured to be connect to the second bias voltage. The first bias voltage and the second bias voltage may not be equal to each other.

The first conductive structure 120a and the second conductive structure 120b may be configured to transfer the electrostatic charges. The first conductive structure 120a may enable the first fin portion 102a to be electrically connect to the first bias voltage; and the second conductive structure 120b may enable the second fin portion 102b to be electrically connect to the second bias voltage. In one embodiment, the second conductive structure 120b may be connected to the electrostatic discharge terminal to input the electrostatic charges; and the first conductive structure 120a may be grounded to release the electrostatic charges.

In one embodiment, the first conductive structure 120a may cross the first fin portion 102a, and the first conductive structure 120a may cover portions of top and side surfaces of the first fin portion 102a. The second conductive structure 120b may cross the second fin portion 102b, and the second conductive structure 120b may cover portions of top and side surfaces of the second fin portion 102b.

However, the configuration or arrangement of the first conductive structure 120a and the second conductive structure 120b are only exemplary. In various embodiments, it may be desired that the first conductive structure 120a and the second conductive structure 120b are respectively electrically connected to the first fin portion 102*a* and the second fin portion 102*b*. Other suitable arrangements may also be used.

The first region 100*a* may also include the first supporting gate structure 110*a* crossing the first fin portion 102*a*; and the second region 100*b* may also include the second supporting gate structure 110*b* crossing the second fin portion 102*b*. Therefore, to reduce the fabrication difficulty and to improve the performance of the device, the first conductive structure 120*a* and the first supporting gate 110*a* may be arranged in parallel to each other; and the second conductive structure 120*b* and the second supporting gate 110*b* may be arranged in parallel to each other.

In one embodiment, in the ESD protection structure, the number of the first conductive structure 120*a* and the second conductive structure 120*b* may be more than one; and the number of the first supporting gate 110*a* and the second supporting gate 110*b* may be more than one. To improve the supporting ability of the supporting gate structure and to improve the gate density in the first region 100*a* and the second region 100*b*, the first conductive structure 120*a* and the first supporting gate 110*a* may be alternately arranged; and the second conductive structure 120*b* and the second supporting gate 110*b* may be alternately arranged.

In one embodiment, the first epitaxial layer 140*a* and the second epitaxial layer 140*b* may be respectively formed on the first fin portion 102*a* and the second fin portion 102*b*. Therefore, the first conductive structure 120*a* may be connected to the first fin portion 102*a* through the first epitaxial layer 140*a*; and the second conductive structure 120*b* may be connected to the second fin portion 102*b* through the second epitaxial layer 140*b*.

The first conductive structure 120*a* and the second conductive structure 120*b* can be formed simultaneously. Specifically, forming the first conductive structure 120*a* and the second conductive structure 120*b* may include: forming a sixth mask on the dielectric layer 121, where the sixth mask may be configured to define the position and dimensions of the first conductive structure 120*a* and the second conductive structure 120*b*; using the sixth mask as a mask, an etching process may be performed onto the dielectric layer 121 to form a trench in the dielectric layer 121, where the bottom of the trench may expose the surface of the first epitaxial layer 140*a* and the second epitaxial layer 140*b*; filling the trench with conductive materials; and planarizing the conductive materials until the dielectric layer 121 is exposed, to form the first conductive structure 120*a* and the second conductive structure 120*b* in the trench. Specifically, the conductive materials may include one or more of copper, tungsten, aluminum, titanium, tantalum, titanium nitride, and titanium nitride.

As shown in FIG. 7, after forming the conductive structure, a first conductive layer and a second conductive layer may be formed (S207).

As shown in FIGS. 3-6, in one embodiment, the first supporting gate 110*a* may be electrically connected to the first bias voltage, and the second supporting gate 110*b* may be electrically connected to the second bias voltage. Therefore, after forming the conductive structure in the dielectric layer 121, the method may also include: forming a first conductive layer 130*a* on the dielectric layer 121 and contacted with the first supporting gate 110*a* and the first conductive structure 120*a*, receiving the first bias voltage; and forming a second conductive layer 130*b* on the dielectric layer 121 and contacted with the second supporting gate 110*b* and the second conductive structure 120*b*, receiving the second bias voltage.

Specifically, in one embodiment, the first supporting gate 110*a* and the first fin portion 102*a* may be grounded through the first conductive layer 130*a*. The second supporting gate 110*b* and the second fin portion 102*b* may be connected to the electrostatic discharge terminal through the second conductive layer 130*b*. Therefore, conduction current may be less likely to be generated in the first fin portion 102*a* and the second fin portion 102*b*. The electrostatic charges may be less likely to completely flow within the well area 101. Leakage current in the supporting gate structure may be reduced. The functions of the first supporting gate 110*a* and the second supporting gate 110*b* are only exemplary. In certain other embodiments, the first supporting gate and the second supporting gate may not load any signals. Other arrangements may also be used.

The first conductive layer and the second conductive layer can be formed simultaneously. Specifically, forming the first conductive layer and the second conductive layer may include: forming a conductive material layer on the dielectric layer 121; forming a seventh mask on the conductive material layer, where the seventh mask may be configured to define the position and dimensions of the first conductive layer 130*a* and the second conductive layer 130*b*; and using the seventh mask as a mask, an etching process may be performed onto the conductive material layer until the surface of the dielectric layer 121 is exposed, to form the first conductive layer and the second conductive layer.

In one embodiment, the first conductive layer 130*a* may be in a stripe or bar shape, and the first supporting gate 110*a* and the first conductive structure 120*a* may be arranged in parallel with each other. Thus the first conductive layer 130*a* may be vertically arranged with or perpendicular to the first supporting gate 110*a* and the first conductive structure 120*a*. The second conductive layer 130*b* may also have a stripe or bar shape, and the second supporting gate 110*b* and the second conductive structure 120*b* may be arranged in parallel with each other. Thus, the second conductive layer 130*b* may be vertically arranged with or perpendicular to the second supporting gate 110*b* and the second conductive structure 120*b*.

Accordingly, by providing the supporting gate structure in the first region and the second region, when the process of forming the dielectric layer and the process of forming semiconductor structures in other regions of the substrate are performed, the supporting gate structure may improve the stability of the polishing process in the first region and the second region. When the chemical mechanical polishing process is performed, the concavities may not be prone to be formed on the surface of the dielectric layer in the first region and the second region through the support of the supporting gate structure, expanding the process window of the chemical mechanical process and improving the manufacturing yield of the formed ESD protection structure. In addition, the ESD protection structure may also include the first epitaxial layer in the first fin portion at both sides of the first supporting gate, and the second epitaxial layer in the second fin portion at both sides of the second supporting gate. Because of the isolation effect of the supporting gate structure, the first epitaxial layer and the second epitaxial layer may be distributed in the supporting gate structure. Such structure may be able to avoid forming large-area epitaxial layers on the surface of the ESD protection structure; avoid the accumulation of the electrostatic charges on the large-area epitaxial layer; and improve the performance of the ESD protection structure.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to 10 those persons of ordinary skill in the art. Any equivalent or modification thereof, without departing from the spirit and principle of the present invention, falls within the true scope of the present invention.

What is claimed is:

1. An electrostatic discharge (ESD) protection structure, comprising:
   a substrate having a first region and a second region, wherein the first region and the second region are separated by a preset distance;
   a well area formed in the substrate, wherein the well area covers the first region, the second region, and a region between the first region and the second region;
   a first fin portion formed in the substrate in the first region and a second fin portion formed in the substrate in the second region, wherein the first fin portion has first-type doping ions and the second fin portion has second-type doping ions;
   a dielectric layer, wherein the dielectric layer covers the well area between the first region and the second region, the first fin portion, and the second fin portion;
   a supporting gate structure formed in the dielectric layer, wherein the supporting gate structure includes a first supporting gate crossing the first fin portion and covering portions of top and side surfaces of the first fin portion, and a second supporting gate crossing the second fin portion and covering portions of top and side surfaces of the second fin portion;
   a conductive structure formed in the dielectric layer, wherein the conductive structure includes a first conductive structure connecting to the first fin portion and being configured to connect to a first bias voltage, and a second conductive structure connecting to the second fin portion and being configured to connect to a second bias voltage, and the first bias voltage and the second bias voltage are not equal to one another;
   a first conductive layer formed on the dielectric layer and a top surface of the first supporting gate; and
   a second conductive layer formed on the dielectric layer and a top surface of the second supporting gate.

2. The ESD protection structure according to claim 1, wherein:
   the first conductive structure crosses the first fin portion, and the first conductive structure covers portions of top and side surfaces of the first fin portion; and
   the second conductive structure crosses the second fin portion, and the second conductive structure covers portions of top and side surfaces of the second fin portion.

3. The ESD protection structure according to claim 1, wherein:
   the first conductive structure and the first supporting gate are arranged in parallel; and
   the second conductive structure and the second supporting gate are arranged in parallel.

4. The ESD protection structure according to claim 1, wherein:
   a number of the first conductive structure and the second conductive structure is more than one;
   a number of the first supporting gate and the second supporting gate is more than one;
   the first conductive structure and the first supporting gate are alternately arranged; and
   the second conductive structure and the second supporting gate are alternately arranged.

5. The ESD protection structure according to claim 1, wherein:
   the first supporting gate is electrically connected to the first bias voltage; and
   the second supporting gate is electrically connected to the second bias voltage.

6. The ESD protection structure according to claim 1, wherein
   the first conductive layer receiving the first bias voltage; and
   the second conductive layer receiving the second bias voltage.

7. The ESD protection structure according to claim 6, wherein:
   the first conductive layer and the second conductive layer are bar-shaped;
   the first supporting gate and the first conductive structure are arranged in parallel, and the first conductive layer is vertically arranged with the first supporting gate and the first conductive structure; and
   the second supporting gate and the second conductive structure are arranged in parallel, and the second conductive layer is vertically arranged with the second supporting gate and the second conductive structure.

8. The ESD protection structure according to claim 1, wherein:
   the second region surrounds the first region.

9. The ESD protection structure according to claim 1, wherein:
   the first region is a square-shaped region; and
   the second region is a square annular-shaped region.

10. The ESD protection structure according to claim 1, wherein:
    the preset distance between the first region and the second region is in a range of approximately 0.2-1 um.

11. The ESD protection structure according to claim 1, wherein:
    the supporting gate structure is a dummy gate;
    the supporting gate structure is made of polysilicon; or
    the supporting gate structure is a polysilicon gate or a metal gate.

12. The ESD protection structure according to claim 1, further including:
    a first epitaxial layer formed in the first fin portion at both sides of the first supporting gate, wherein the first epitaxial layer has the first-type doping ions;
    a second epitaxial layer formed in the second fin portion at both sides of the second supporting gate, wherein the second epitaxial layer has the second-type doping ions;
    the first conductive structure connects to the first fin portion through the first epitaxial layer; and
    the second conductive structure connects to the second fin portion through the second epitaxial layer.

13. The ESD protection structure according to claim 12, wherein
    the first supporting gate divides the first epitaxial layer into many small-area epitaxial layers; and
    the second supporting gate divides the second epitaxial layer into many small-area epitaxial layers.

14. The ESD protection structure according to claim 1, wherein:
    the first epitaxial layer is an "Σ" shaped epitaxial layer made of silicon and germanium materials; and
    the second epitaxial layer is a square-shaped epitaxial layer made of silicon and carbon materials.

15. The ESD protection structure according to claim 1, wherein:
- the first-type doping ions are P-type ions;
- the second-type doping ions are N-type ions; and
- the well area is an N-type well area.

16. The ESD protection structure according to claim 1, wherein:
- the first region is configured to form a first anode connected to a ground;
- the second region is configured to form a second anode connected to the ground.

17. The ESD protection structure according to claim 1, wherein forming the first conductive layer and the second conductive layer comprising:
- forming a conductive material layer on the dielectric layer;
- forming a mask on the conductive material layer, where the mask is configured to define the position and dimensions of the first conductive layer and the second conductive layer; and
- etching the conductive material layer until the surface of the dielectric layer is exposed to form the first conductive layer and the second conductive layer.

18. The ESD protection structure according to claim 1, wherein:
- the second region is parallel to the first region.

* * * * *